United States Patent
Joshi et al.

(10) Patent No.: US 7,885,798 B2
(45) Date of Patent: Feb. 8, 2011

(54) CLOSED-LOOP MODELING OF GATE LEAKAGE FOR FAST SIMULATORS

(75) Inventors: Rajiv V. Joshi, Yorktown Heights, NY (US); Rouwaida N. Kanj, Round Rock, TX (US); Ying Liu, Austin, TX (US); Sani R. Nassif, Austin, TX (US); Jayakumaran Sivagnaname, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 813 days.

(21) Appl. No.: 11/746,976

(22) Filed: May 10, 2007

(65) Prior Publication Data

US 2008/0281570 A1 Nov. 13, 2008

(51) Int. Cl.
*G06F 17/50* (2006.01)
*G06F 7/62* (2006.01)

(52) U.S. Cl. .......................................... 703/13; 703/14
(58) Field of Classification Search .................... 703/13, 703/14; 716/1
See application file for complete search history.

(56) References Cited

U.S. PATENT DOCUMENTS 5,404,319 A * 4/1995 Smith et al. ................... 716/18
6,718,524 B1 * 4/2004 Mbouombouo ................ 716/4
7,149,674 B1 * 12/2006 Sirichotiyakul et al. ....... 703/15
2005/0125761 A1 * 6/2005 Jacobson et al. ............. 716/18

OTHER PUBLICATIONS

R. Rao at al., "Efficient Techniques for Gate Leakage Estimation," Proceedings of the 2003 Intl. Symp. on Low power Elec. and Design, pp. 100-103 (2003).
W. Liu et al., "BSIM3v3.3 MOSFET Model Users' Manual," Dept. of EE and CS University of California (2005).

* cited by examiner

*Primary Examiner*—David Silver
(74) *Attorney, Agent, or Firm*—Libby Z. Handelsman; Jack V. Musgrove

(57) ABSTRACT

A method for circuit simulation using a netlist in which a first device having an unmodeled, nonlinear behavior is modified by inserting a second device which has a nonlinear response approximating the unmodeled nonlinear behavior. The first device may be for example a first transistor and the second device may be a variable current source, in particular one whose current is modeled after a floating transistor template which represents gate leakage current of the first transistor (gate-to-source or gate-to-drain). During simulation of the circuit a parameter such as a gate-to-source voltage of the second transistor is controlled to model gate leakage. The model parameters can be a function of an effective quantum mechanical oxide thickness value of a gate of the first transistor technology.

11 Claims, 6 Drawing Sheets

$$I_{DS} = \begin{matrix} k * (V_{GS}-V_T)*V_{DS} & V_{GS}-V_T > V_{DS} \\ k * (V_{GS}-V_T)^2 & V_{GS}-V_T < V_{DS} \end{matrix}$$

CLOSED-LOOP MODELING OF GATE LEAKAGE FOR FAST SIMULATORS

BACKGROUND OF THE INVENTION

1. Field of the Invention

The present invention generally relates to the design and testing of semiconductor chips and integrated circuits, and more particularly to a method of simulating circuit operation using netlists and transient analysis.

2. Description of the Related Art

Integrated circuits are used for a wide variety of electronic applications, from simple devices such as wristwatches, to the most complex computer systems. A digital microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells, memory cells and input/output (I/O) cells.

An IC chip is fabricated by first conceiving the logical circuit description, and then converting that logical description into a physical description, or geometric layout. The physical design process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern one or more dies on a silicon wafer using a sequence of photolithographic steps.

Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates, insert buffers, clone gates, etc., so the area of logic in the design remains fluid. However, physical synthesis can take days to complete.

Two popular circuit simulators used in physical synthesis are SPICE and ACES. SPICE is a transistor-level simulator which depends on BSIM device models that represent model behaviors in terms complex physical equations (numerical integration formulae) embedded in code. BSIM (Berkeley short-channel IGFET model) is a physics-based, predictive metal-oxide, semiconducting field-effect transistor (MOSFET) model for circuit simulation. SPICE uses a netlist file that contains a description of the circuit with appropriate resistance, inductance and capacitance values corresponding to respective nodes as well as nonlinear devices such as transistors or diodes. An analysis is performed at an initial time, the time variable is then incremented, and an analysis is performed at that next time step, with the process repeating until the final time step is reached. ACES (adaptively controlled explicit simulation) is a transistor-level simulation technique for analysis of timing, power and noise in a variety of integrated circuits and systems. ACES depends on tabular abstractions or piecewise linear approximation to device models, and is from the family of fast simulators.

Faster performance and predictability of responses are elements of interest in circuit designs. As process technology scales to the deep-submicron (DSM) regime, it becomes more difficult to accurately model circuit performance, particularly regarding unknown behaviors of circuit components. While the foregoing simulation tools are reasonably efficient (fast) in carrying out circuit analysis, they do not adequately account for less predictable behaviors such as gate leakage in a nonlinear device (e.g., transistor). Gate dielectric leakage current becomes a serious concern, as sub-20 Å gate oxide prevails in advanced complementary metal-oxide semiconducting (CMOS) processes. Oxide layers this thin can conduct significant leakage current by various tunneling mechanisms and degrade circuit performance. The three major leakage mechanisms for a CMOS structure are electron conduction-band tunneling, electron valence-band tunneling, and hole valence-band tunneling. Each mechanism is dominant or important in different regions of operation for p-type or n-type devices. The gate tunneling current is composed of several components, including a gate-to-substrate leakage current, parasitic leakage currents through gate-to-source and gate-to-drain extension overlap regions, and gate-to-inverted channel tunneling current.

The aforementioned simulators, and in particular fast simulators like ACES, lack gate-leakage models. Gate tunneling is just one example of the difficult behaviors that need to be modeled. Most prior art simulators (whether deterministic or statistical) do not support external complex equations or complex controlled sources, and adding a new model to a simulator can be very difficult. Whenever an unmodeled device behavior arises, it takes intense effort to develop the new code for that model (e.g., BSIM) such that it is usable in a simulator like SPICE. For purposes of fast simulators, a new model means additional piecewise model variables and more engineering development effort which is also a daunting task. Offering options like complex nonlinear equations can slow down fast simulators and requires the addition of interpreters which further slow them down. These problems result in fast simulators that fail to capture secondary nonlinear and new nonlinear unmodeled behaviors.

One approach to estimating gate leakage is to replace the device in the netlist with one having an additional linear element such as a constant current source or resistor. This technique is illustrated in FIGS. 1A and 1B which depict an exemplary circuit in the form of a memory cell 4. Memory cell 4 has two cross-coupled inverters formed by transistor pairs; the left inverter has a p-type transistor PL and an n-type transistor NL, and the right inverter has a p-type transistor PR and an n-type transistor NR. The drains of the p-type transistors are connected to the power supply voltage ($V_{dd}$) and the sources of the n-type transistors are connected to electrical ground. The nodes between respective p-type and n-type transistors are storage nodes L and R with the true value of the stored data at storage node R; for example, when the stored value in memory cell 4 is zero, the voltage at node R corresponds to logical zero and the voltage at node L corresponds to logical one. Two sense transistors SL and SR couple the storage nodes to the complement bit line BLC and the true bit line BLT. The sense transistors are controlled by a word line signal WL.

FIG. 1A represents the circuit as provided in the original netlist. FIG. 1B represents a modified netlist for a memory cell 4' wherein a resistor 6 is inserted in parallel with the gate and source of transistor NL to model gate-to-source leakage at that transistor. This approach uses a linear element for the gate leakage in the transient simulation, and does not capture the nonlinear behavior.

Another approach is to rely on two rounds of transient simulations. During the first round, the simulation is performed without the nonlinear behavior and node information is collected. An external program uses this information to build a nonlinear current waveform table. A second round of transient analysis then re-simulates the circuit using current waveforms based on first round (more than one round may be necessary). The common power analysis methodology (CPAM) power-analysis tool that uses ACES as its simulation engine relies on this approach. That tool averages out the first round node values and calculates an average gate leakage value based on this first round node info. While this approach provides some accounting for gate leakage, it is not particularly accurate.

There have been other attempts at quantifying gate leakage such as that described in the article "Efficient Techniques For Gate Leakage Estimation," by R. Rao et al., Proceedings of the 2003 International Symposium on Low Power Electronics and Design, pp. 100-103 (2003). Those techniques use a circuit level approximation which is adequate for library characterization but not for transient analysis. The method is only applicable for gate leakage estimation once the circuit has reached steady state (i.e., the internal nodes have settled to their dc values).

In light of the foregoing it would be desirable to devise an improved method which more accurately models nonlinear behaviors in electronic devices and can easily be implemented in a fast simulator. It would be further advantageous if the method could allow transient analysis to be performed in only one round.

SUMMARY OF THE INVENTION

It is therefore one object of the present invention to provide an improved method of modeling electronic circuits which can more accurately account for nonlinear behaviors such as gate leakage.

It is another object of the present invention to provide such a method which can allow transient analysis to be performed in a single round.

It is yet another object of the present invention to provide a fast circuit simulator which can model unknown, nonlinear behaviors without adding significant overhead to the simulator library.

The foregoing objects are achieved in a method of modeling a circuit, by receiving a netlist or circuit description for the circuit which includes a first device having an unmodeled nonlinear behavior, inserting in the circuit description a second device connected (directly or indirectly) to selected nodes of the first device and having a nonlinear response which approximates the unmodeled nonlinear behavior, and simulating operation of the circuit using the modified circuit description while controlling one or more model parameters of the second device. The first device may be for example a first transistor, and the second device may be a variable (controlled) current source which represents gate leakage current of the first transistor such as a gate-to-source leakage current, in which case the controlled model parameters include a gate voltage of a second transistor which is used as a template to derive the current of the variable current source. The model parameters can be a function of an effective quantum mechanical oxide thickness value of a gate of the first transistor technology.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present invention provides a novel method for circuit simulation which is generally applicable to any type of integrated circuit (IC) design including general-purpose microprocessors, memory units or special-purpose circuitry, although it is particularly suited for analyzing circuits comprised of silicon-on-insulator (SOI) devices. The method may be utilized as part of a physical synthesis process which optimizes placement, timing, power consumption, crosstalk effects or other design parameters. As explained more fully below, an exemplary implementation of the present invention inserts a variable (controlled) current source into a netlist for a circuit design having a nonlinear response to account for nonlinear or unknown behaviors such as gate leakage and thereby more accurately simulate operation of the circuit.

Figure 2:
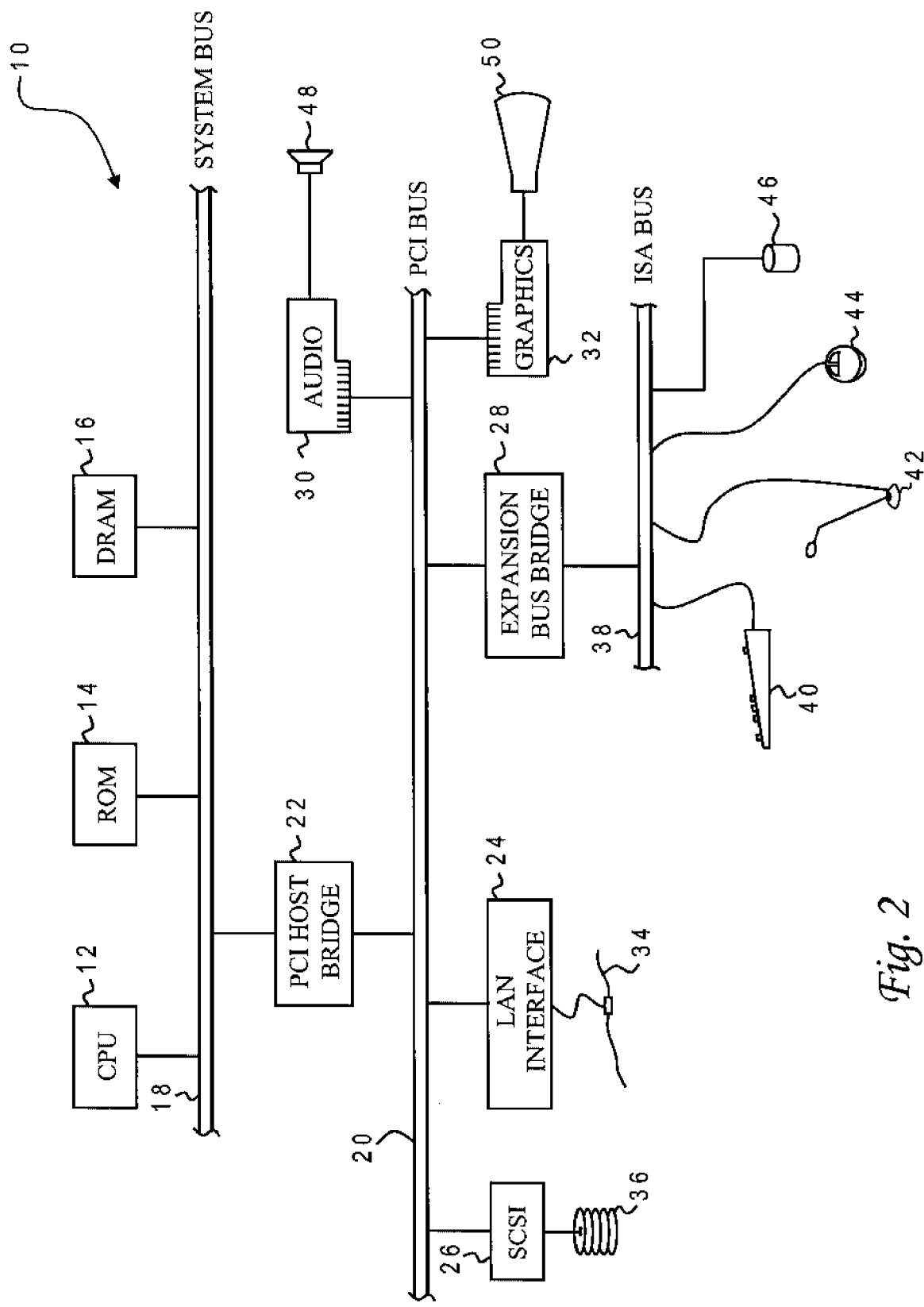
FIG. 2 is a block diagram of a computer system programmed to carry out modeling of an integrated circuit design in accordance with one implementation of the present invention.

With reference now to the figures, and in particular with reference to FIG. 2, there is depicted one embodiment 10 of a computer system programmed to carry out netlist modification and circuit simulation in accordance with one embodiment of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below and result data representing the simulated operation of the circuit. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out netlist modification as taught herein.

While the illustrative implementation provides the program instructions embodying the present invention on disk drive 36, those skilled in the art will appreciate that the invention can be embodied in a program product utilizing other computer-readable media. The program instructions may be written in the C or C++ programming language for an AIX environment. Computer system 10 carries out program instructions for simulation of digital or analog circuits adapted for use in an integrated circuit. Accordingly, a program embodying the invention may include conventional aspects of various IC design tools, and these details will become apparent to those skilled in the art upon reference to this disclosure.

Figure 1A:
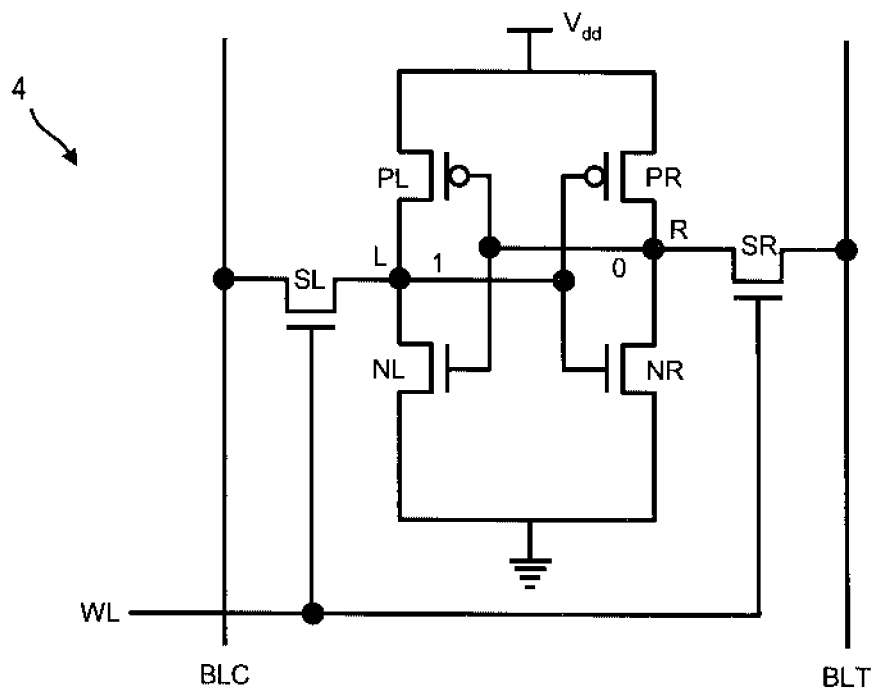
FIGS. 1A and 1B are schematic diagrams of a memory cell circuit corresponding to netlists for a proposed circuit design wherein gate leakage for one of the transistors is conventionally approximated by a linear element (resistor) across the gate and source of the transistor.
Figure 1B:
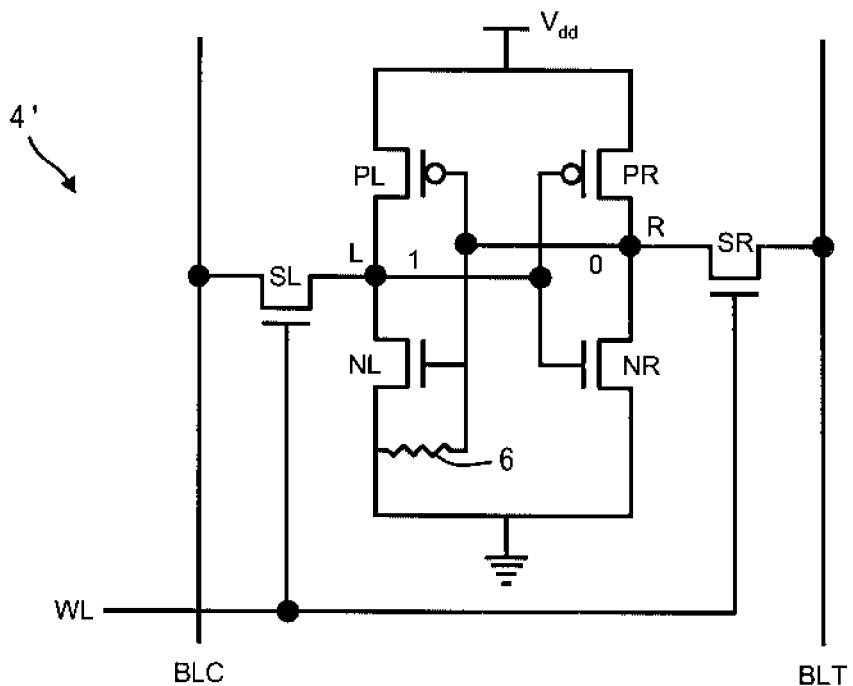
Figure 3:
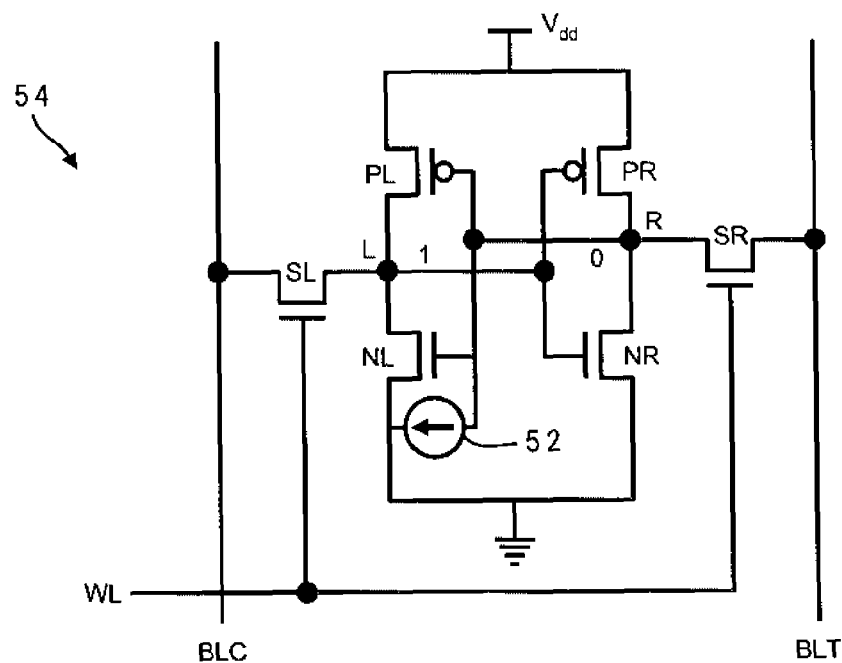
FIG. 3 is a schematic diagram of a memory cell circuit corresponding to a netlist for a proposed circuit design wherein gate leakage is modeled as a variable current source in accordance with one implementation of the present invention.

The present invention provides an improved method of modeling nonlinear or unknown behaviors in a circuit, such as gate leakage of a transistor, by introducing a variable current source to represent the behavior. The variable current source is derived using existing nonlinear model templates in the simulator library such as a transistor template. The method enables fast, on-the-run transient analysis that accounts for the unmodeled nonlinear behavior. FIG. 3 illustrates one example of how the invention might be implemented for the memory cell circuit of FIG. 1. In order to model gate-to-source leakage at the left n-type transistor NL, a variable current source 52 is inserted in the netlist at the selected nodes of transistor NL to create the modified memory cell circuit 54. The current flowing through variable current source 52 thus represents the gate leakage current $I_{gate}$ of transistor NL. Transient analysis is then performed while controlling one or more model parameters of variable current source 52.

The invention may be expeditiously carried out using a circuit analysis tool (deterministic or statistical) that already includes nonlinear models for transistors or other devices and is enhanced to account for gate leakage and other unmodeled (nonlinear) behaviors by using adaptations of those models. The invention is particularly suited for enhancing a fast simulator such as an ACES tool. The tool is enhanced by providing a table which precharacterizes one or more response parameters of the variable current source. The precharacterization is done once per technology node, and the parameters are known and fixed for a given simulation (i.e., they are only set once per technology node).

Figure 4A:
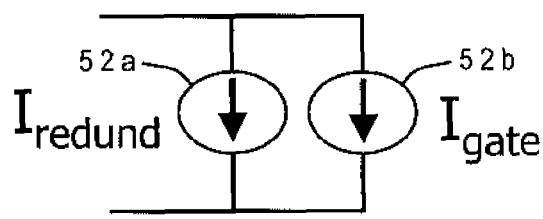
FIG. 4A is a schematic detail showing a preferred implementation for the variable current source of FIG. 3 comprised of a redundant current source and a gate model current source.
Figure 4B:
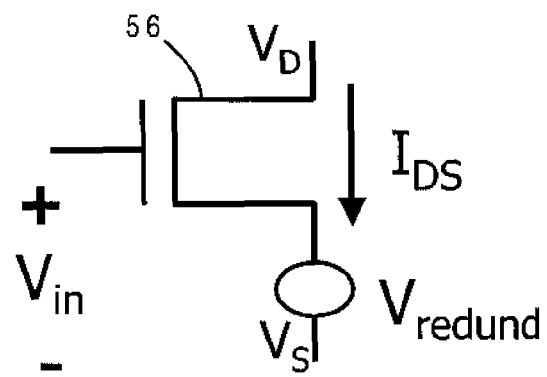
FIG. 4B is a schematic diagram of a transistor model used to derive the current for the gate model current source of FIG. 4.

One method for precharacterization of the variable current source is explained with further reference to FIGS. 4A and 4B. In this implementation of the invention, the variable current source is represented by a first, redundant current source 52a having a current $I_{redund}$ and a second, gate model current source 52b having a current $I_{gate}$ as seen in FIG. 4A. Redundant current source 52a and gate model current source 52b are connected in parallel. The redundant current $I_{redund}$ is set to zero, and redundant current source 52a monitors the voltage difference ($\Delta V$) across the nodes of interest, e.g., the gate-to-source voltage of transistor NL. The gate model current $I_{gate}$ is then modeled using a floating transistor 56 as seen in FIG. 4B. The source voltage $V_S$ and drain voltage $V_D$ of floating transistor 56 are set to optimal values that minimize model error as described further below, and its gate voltage $V_{in}$ is controlled during simulation to be equal to $\Delta V$. The gate model current is proportional to the output current of transistor 56, i.e., $I_{gate}=\alpha^*I_{DS}$, where $\alpha$ is a scale factor. Floating transistor 56 uses separate voltage references and is not directly connected to the nodes of transistor NL since inserting a transistor in that manner would introduce unwanted capacitance into the netlist.

Figure 5:
FIG. 5 is a graph illustrating how transistor drain current is conventionally modeled with nonlinear (quadratic) behavior as a function of applied voltage.

Advantageously, a template for $I_{DS}$ is available in existing simulation tools as a function of gate-to-source voltage $V_{GS}$, drain-to-source voltage $V_{DS}$, and threshold voltage $V_T$. As illustrated in FIG. 5, gate leakage simulations exhibit quadratic behavior as a function of $\Delta V$ for the regions of interest, and fit nicely with the conventional nonlinear formula;

$$I_{DS}=k^*(V_{GS}-V_T)^*V_{DS} \text{ for } V_{GS}-V_T>V_{DS},$$

$$k^*(V_{GS}-V_T)^2 \text{ for } V_{GS}-V_T<V_{DS},$$

where k is a known model constant for a particular device in the tool library with a given input. The invention thus takes advantage of existing templates to easily capture unknown device behaviors (whatever behaviors fit with the particular template).

Figure 6A:
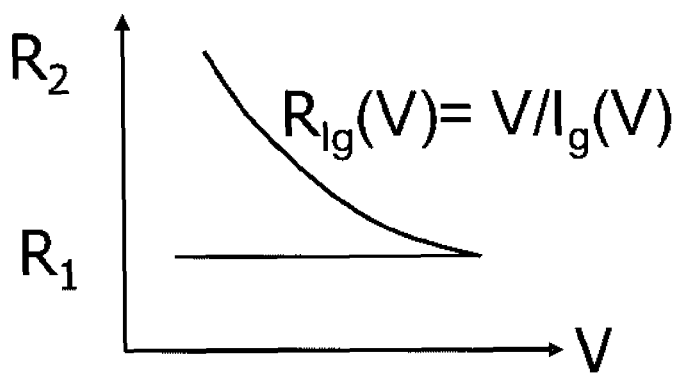
FIGS. 6A and 6B are graphs illustrating resistance functions which are used to construct a scaling factor for estimating gate leakage in accordance with one implementation of the present invention.
Figure 6B:
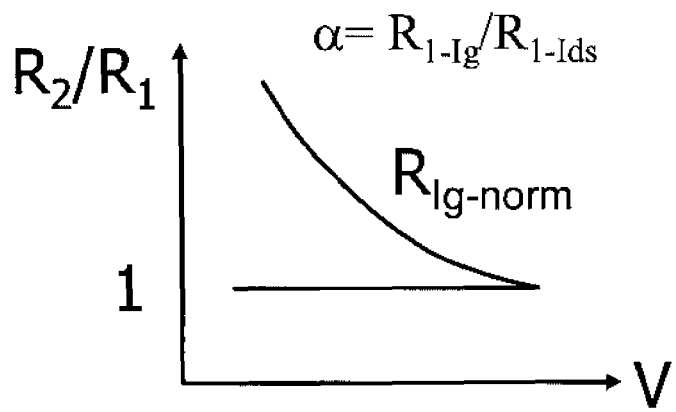

The scale factor α is preferably constructed by considering the variable current source as having a nonlinear resistance function $R_{1g}(\Delta V)=\Delta V/I_{gate}(\Delta V)$ which varies between a first resistance $R_{1-Ig}$ corresponding to maximum gate leakage and a second resistance $R_{2-Ig}$ corresponding to a minimum gate leakage (over the voltage range of interest) as illustrated in FIG. 6A. The model drain-to-source resistance of the inserted transistor is similarly considered as a nonlinear function $R_{Ids}$ $(V_{in}=\Delta V)=\Delta V/I_{DS}(\Delta V)$ which varies between a first resistance $R_{1-Ids}$ corresponding to maximum gate leakage and a second resistance $R_{2-Ids}$. The scale factor may thus be computed as $\alpha=I_{DS}/I_{gate}=R_{1-Ig}/R_{1-Ids}$ for the potential maximum gate leakage. The value of $R_{1-Ig}$ is found using hardware measurements or more complex models such as BSIM, and values for $R_{1-Ids}$ can be derived by finding fixed values for drain and source voltages $V_D$ and $V_S$ at transistor 56 to minimize an error function between normalized versions of those resistances (other properties of transistor 56 can also be exploited and modified to minimize error as desired). The resistance functions are normalized as illustrated in FIG. 6B through division of $R_2$ by $R_1$ to arrive at normalized resistance functions $R_{Ig-norm}(V)$ and $R_{Ids-norm}(V)$. The error function to be minimized according to this implementation is given as:

$$\Sigma |R_{Ig-norm}(V)-R_{Ids-norm}(V)|^2.$$

Exemplary values for $R_{Ig-norm}$ and $R_{Ids-norm}$ with a $V_{GS}$ of 0.7-1.3 volts range from around 3.5 to 1.0. The fixed values for $V_D$ and $V_S$ which minimize the error function are then used to select the value for $R_{1-Ids}=\Delta V/I_{DS}$, which is then divided into $R_{1-Ig}$ to compute α.

Figure 7:
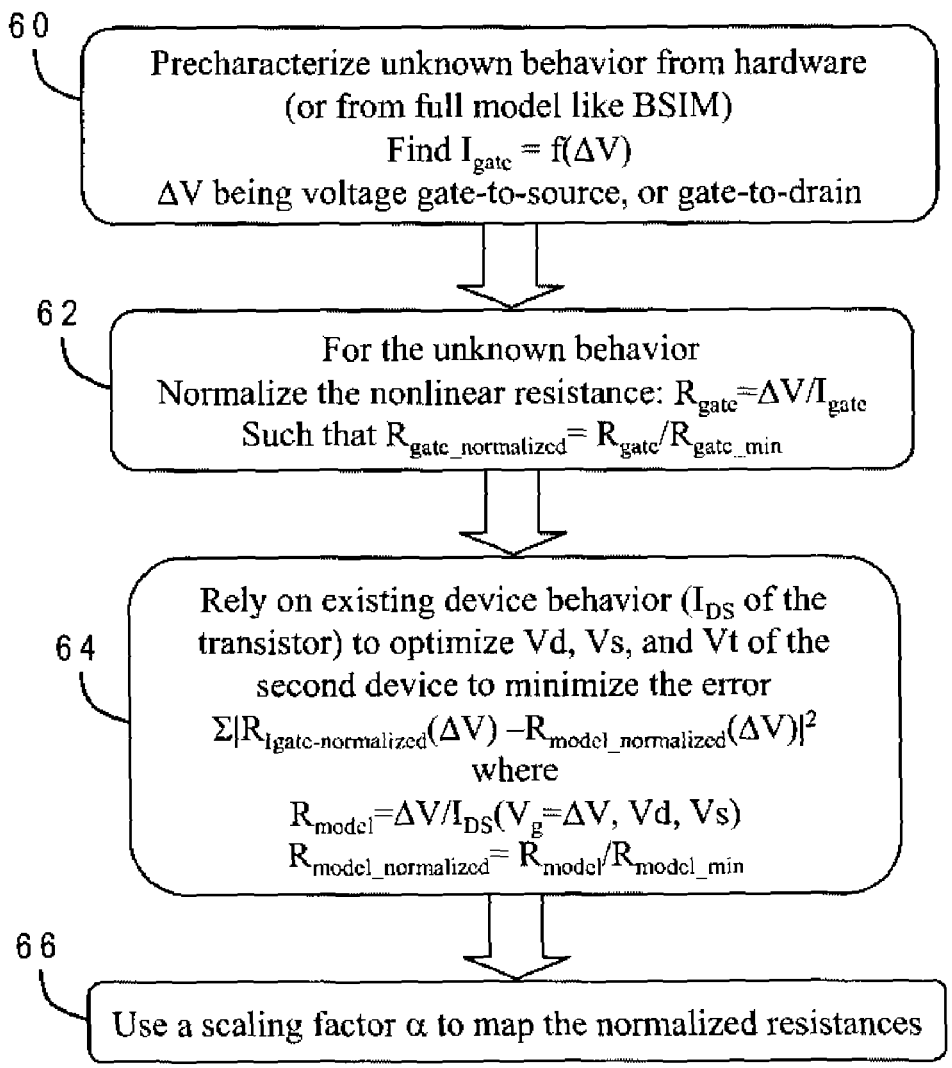
FIG. 7 is a chart illustrating the logical flow for modeling a nonlinear behavior such as gate leakage prior to simulations in accordance with one implementation of the present invention.
Figure 8:
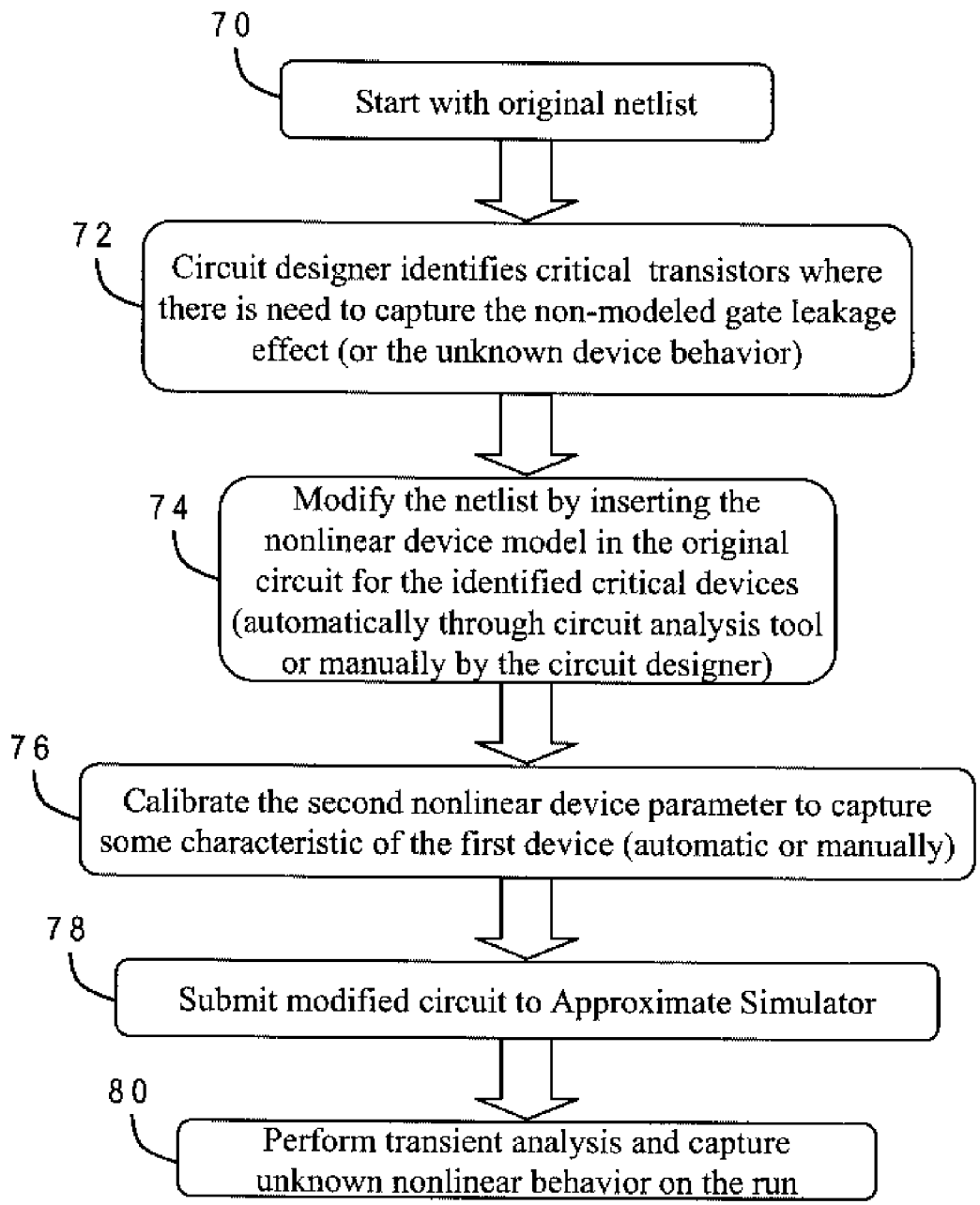
FIG. 8 is a chart illustrating the logical flow for circuit simulation including gate leakage modeling in accordance with one implementation of the present invention.

The present invention may be further understood with reference to the flow charts of FIGS. 7 and 8 which depict the modeling phase and the implementation phase of the invention, respectively. The modeling phase begins in FIG. 7 with precharacterization of the unknown behavior from hardware or from a more complete model such as BSIM (60). The precharacterization in the illustrative embodiment includes finding the current as a function of voltage, wherein the voltage (ΔV) is gate-to-source or gate-to-drain as desired. The nonlinear resistance function $R_{gate}=\Delta V/I_{gate}$ for the unknown behavior is normalized (62) and existing device behavior, for example $I_{DS}$, is used to optimize parameters of the inserted device such as $V_D$, $V_S$, and $V_T$ to minimize the error function between the normalized resistance functions (64). The scaling factor α is used to map the normalized resistances to the true values (66). The invention may further taken into account variabilities such as those associated with the effective (quantum mechanical) oxide thickness value TOXQM of the transistor gate, i.e., the model scaling parameter α may be a function of TOXQM.

After the model parameters have been provided and scaling factors have been determined (once per device technology), these values can be used in carrying out the circuit simulation as shown in FIG. 8. The modeling process begins with a netlist or other logical description for the circuit which is provided using a conventional electronic design automation (EDA) tool (70). The circuit designer identifies potentially critical transistors or other devices where there is a need to capture unmodeled behaviors such as gate leakage effects (72). This selection may be automated according to particular design criteria for given types of circuits or logic cells. The netlist is then modified by inserting a device model having the nonlinear response into the original circuit for the identified critical device(s), automatically through the circuit analysis tool or manually by the circuit designer (74). The inserted nonlinear device parameter is calibrated to capture some characteristic of the first device (76), and the modified circuit with the proper model parameters is submitted to an approximate simulator such as SPICE (78). Transient analysis is carried out on the modified circuit while controlling one or more parameters of the nonlinear device (like setting $V_{in}$ of the floating transistor to the voltage ΔV across the transistor NL) to capture the previously unknown behavior on the run (80). The simulation of the circuit operation may be repeated for statistical analysis purposes with varying values for α.

This flow is for modeling gate-to-source or gate-to-drain tunneling currents. For gate-to-body tunneling current, the effect can be effectively simulated by modifying the threshold voltage of the primary device (transistor NL), again relying on an existing MOSFET model, or equivalently by adding a current source that accounts for the difference in threshold voltage. This effect can also be modeled as a function of TOXQM.

The present invention accordingly provides an efficient technique for modeling unknown or nonlinear behaviors without adding significant complexity to a fast simulator. Existing MOSFET device models and device parameters can be used as the template to model a wide variety of other nonlinear behaviors (e.g., sub-threshold leakage). The invention thereby enables accurate simulations without the need for multiple rounds of transient analysis.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of a variable current source comprising a single transistor, more complicated variable current source models can be used for more complicated behaviors. It is therefore contemplated that such modifications can be made without departing from the spirit or scope of the present invention as defined in the appended claims.

What is claimed is:

1. A method of modeling a circuit using a computer system, comprising:

receiving a circuit description for the circuit wherein the circuit description includes at least a first device having an unmodeled nonlinear behavior, the first device is a first transistor, and the unmodeled nonlinear behavior is gate leakage current of the first transistor;

inserting in the circuit description at least a second device to create a modified circuit description, wherein the second device is connected to one or more selected nodes in the circuit description, the second device has a nonlinear response which approximates the unmodeled nonlinear behavior, and the second device has a gate current modeled by a floating transistor;

simulating operation of the circuit using the modified circuit description while controlling one or more model parameters of the second device including a gate voltage of the floating transistor; and storing data representing the simulated operation in the computer system.

2. The method of claim 1 wherein the gate leakage current is a gate-to-source leakage current and the second device is connected between a gate node of the first transistor and a source node of the first transistor.

3. The method of claim 1 wherein the model parameters are a function of an effective quantum mechanical oxide thickness value of a gate of the first transistor.

4. The method of claim 1 wherein the nonlinear response of the second device is modeled using an existing template in a simulator library of the computer system.

5. A computer system comprising:
one or more processors which process program instructions;
a memory device connected to said one or more processors; and
program instructions residing in said memory device for receiving a circuit description for a circuit wherein the circuit description includes at least a first device having an unmodeled nonlinear behavior wherein the first device is a first transistor and the unmodeled nonlinear behavior is gate leakage current of the first transistor, inserting in the circuit description at least a second device to create a modified circuit description wherein the second device is connected to one or more selected nodes in the circuit description, the second device has a nonlinear response which approximates the unmodeled nonlinear behavior, and the second device has a gate current modeled by a floating transistor, and simulating operation of the circuit using the modified circuit description while controlling one or more model parameters of the second device including a gate voltage of the floating transistor.

6. The computer system of claim 5 wherein the gate leakage current is a gate-to-source leakage current and the second device is connected between a gate node of the first transistor and a source node of the first transistor.

7. The computer system of claim 5 wherein the model parameters are a function of an effective quantum mechanical oxide thickness value of a gate of the first transistor.

8. The computer system of claim 5 wherein the nonlinear response of the second device is modeled using an existing template in a simulator library.

9. A computer program product comprising:
a computer-readable storage medium; and
program instructions residing in said storage medium for receiving a circuit description for a circuit wherein the circuit description includes at least a first device having an unmodeled nonlinear behavior wherein the first device is a first transistor and the unmodeled nonlinear behavior is gate leakage current of the first transistor, inserting in the circuit description at least a second device to create a modified circuit description wherein the second device is connected to one or more selected nodes in the circuit description, the second device has a nonlinear response which approximates the unmodeled nonlinear behavior, and the second device has a gate current modeled by a floating transistor, and simulating operation of the circuit using the modified circuit description while controlling one or more model parameters of the second device including a gate voltage of the floating transistor.

10. The computer program product of claim 9 wherein the gate leakage current is a gate-to-source leakage current and the second device is connected between a gate node of the first transistor and a source node of the first transistor.

11. The computer program product of claim 9 wherein the model parameters are a function of an effective quantum mechanical oxide thickness value of a gate of the first transistor.

* * * * *